United States Patent
Yoo et al.

(10) Patent No.: US 11,284,513 B2
(45) Date of Patent: Mar. 22, 2022

(54) APPARATUS AND PRINTED CIRCUIT BOARD INCLUDING PCB EMBEDDED FILTER HAVING VIA GROUP PATTERNS

(71) Applicant: Samsung Electronics Co., Ltd., Suwon-si (KR)

(72) Inventors: Kyungho Yoo, Suwon-si (KR); Namkyoung Kim, Suwon-si (KR); Jaeyong Ko, Suwon-si (KR); Youjin Kim, Suwon-si (KR); Tongho Chung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/994,441

(22) Filed: Aug. 14, 2020

(65) Prior Publication Data
US 2021/0051798 A1  Feb. 18, 2021

(30) Foreign Application Priority Data

Aug. 16, 2019 (KR) .................. 10-2019-0100487

(51) Int. Cl.
| | |
|---|---|
| *H05K 1/11* | (2006.01) |
| *H05K 1/02* | (2006.01) |
| *H01P 1/20* | (2006.01) |

(52) U.S. Cl.
CPC ............. *H05K 1/115* (2013.01); *H01P 1/20* (2013.01); *H05K 1/0233* (2013.01); *H05K 1/0243* (2013.01); *H05K 2201/1006* (2013.01); *H05K 2201/10098* (2013.01)

(58) Field of Classification Search
CPC .......... H05K 1/115; H05K 2201/1006; H05K 2201/10098; H05K 1/0243; H05K 1/0298; H05K 1/0233; H05K 1/16; H01P 1/20; H01P 1/203; H01Q 1/38; H01R 12/55; H01R 24/50
See application file for complete search history.

(56) References Cited

U.S. PATENT DOCUMENTS

| | | | | |
|---|---|---|---|---|
| 3,656,162 | A * | 4/1972 | Mee ..................... | H03H 7/46 370/339 |
| 10,056,922 | B1 * | 8/2018 | Tsvelykh ............ | H01P 1/20345 |
| 2002/0097116 | A1 * | 7/2002 | Mack .................. | H01P 1/207 333/208 |

(Continued)

FOREIGN PATENT DOCUMENTS

| | | |
|---|---|---|
| JP | 2005-311337 A | 11/2005 |
| JP | 2015-65553 A | 4/2015 |

(Continued)

OTHER PUBLICATIONS

English Translation KR 2019-0050039, Published May 10, 2019 (Year: 2019).*

(Continued)

*Primary Examiner* — Steven T Sawyer

(57) ABSTRACT

Various embodiments of the disclosure disclose a device including a main printed circuit board in which a band stop filter that interrupts at least some signals corresponding to a signal received from or transmitted to an antenna module is formed in via group patterns, and an antenna module connected to the main printed circuit board, and a printed circuit board. Various embodiments are possible.

20 Claims, 18 Drawing Sheets

(56) References Cited

U.S. PATENT DOCUMENTS

| | | | |
|---|---|---|---|
| 2007/0040735 A1 | | 2/2007 | Matsuo et al. |
| 2009/0121811 A1 | | 5/2009 | Choi et al. |
| 2013/0057362 A1 | | 3/2013 | Wu et al. |
| 2013/0076457 A1 | | 3/2013 | Jang |
| 2015/0084208 A1 | | 3/2015 | Iida et al. |
| 2015/0364804 A1 | * | 12/2015 | Tong ................. G01S 7/032 342/175 |
| 2018/0040547 A1 | * | 2/2018 | Zuo ............... H01L 23/49827 |
| 2019/0082536 A1 | * | 3/2019 | Park .................. G06F 1/1635 |
| 2020/0395684 A1 | | 12/2020 | Park |

FOREIGN PATENT DOCUMENTS

| | | | |
|---|---|---|---|
| KR | 10-2009-0048981 A | 5/2009 | |
| KR | 10-2013-0033156 A | 4/2013 | |
| KR | 10-2019-0050039 A | 5/2019 | |
| WO | 2009/145237 A1 | 12/2009 | |

OTHER PUBLICATIONS

English Translation JP2005311337, Published Nov. 4, 2005 (Year: 2005).*
English Translation WO2009145237, Published Dec. 3, 2009 (Year: 2009).*
International Search Report dated Nov. 27, 2020 in connection with International Patent Application No. PCT/KR2020/010763, 3 pages.
Written Opinion of the International Searching Authority dated Nov. 27, 2020 in connection with International Patent Application No. PCT/KR2020/010763, 5 pages.

* cited by examiner (560)

(570)

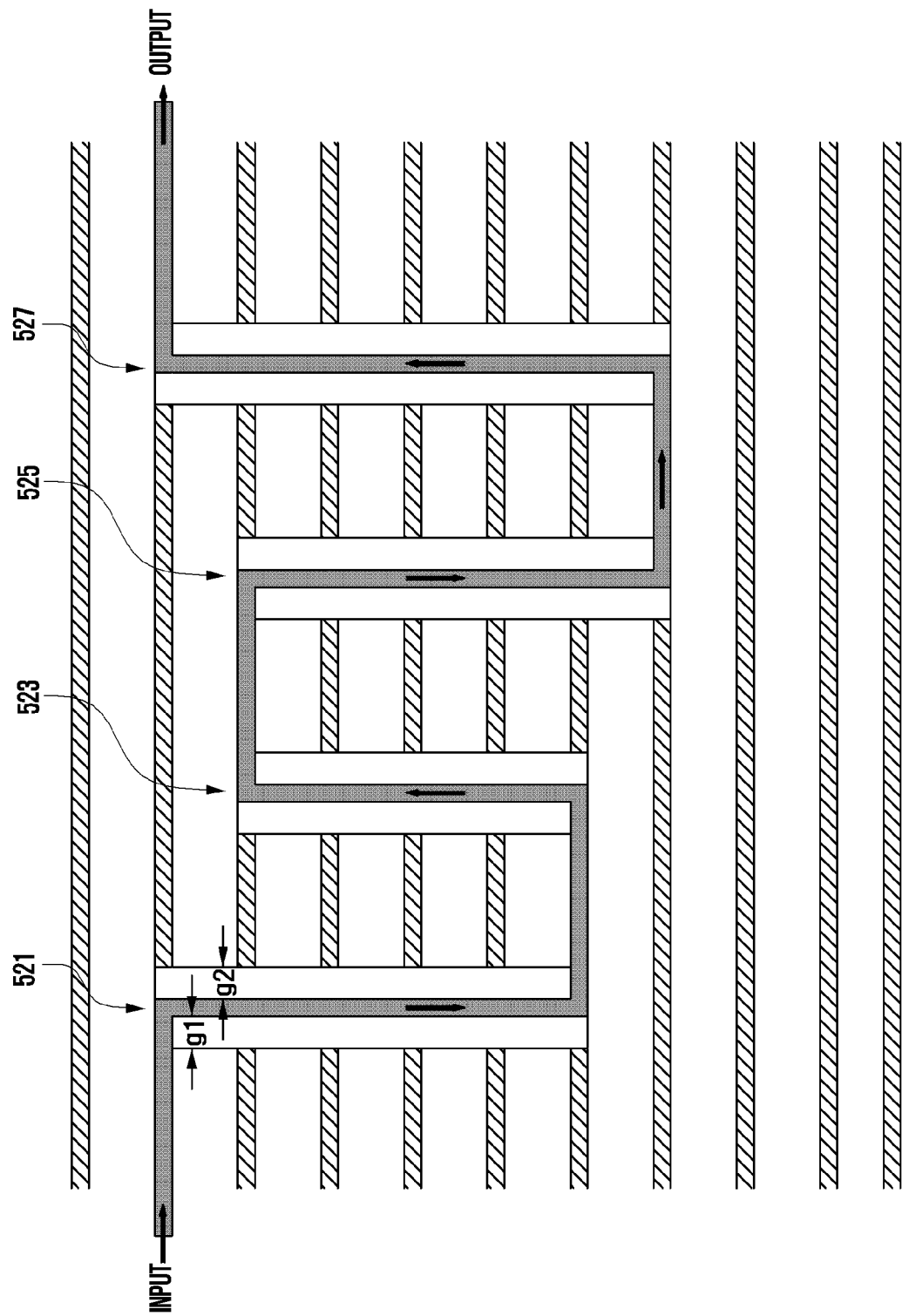

APPARATUS AND PRINTED CIRCUIT BOARD INCLUDING PCB EMBEDDED FILTER HAVING VIA GROUP PATTERNS

CROSS-REFERENCE TO RELATED APPLICATION

This application is based on and claims priority under 35 U.S.C. 119 to Korean Patent Application No. 10-2019-0100487, filed on Aug. 16, 2019, in the Korean Intellectual Property Office, the disclosure of which is herein incorporated by reference in its entirety.

BACKGROUND

1. Field

The disclosure relates to an apparatus including a PCB embedded filter having via group patterns.

2. Description of Related Art

At an initial stage, mobile communication systems were developed to provide voice services while securing the activities of users, but their areas have been gradually expanded to data services as well as voice services. Currently, the mobile communication systems cause lack of resources due to explosive increases of data traffics, and the needs of users who require high-speed data services have converted the systems to a long term evolution (LED) (or LTE-advanced) communication standard (or a fourth generation (4G) communication system), the data transmission speeds of which have been improved.

Moreover, even after the commercialization of a 4G communication system, in order to secure a high data transmission speed, a high data transmission rate, and a wide bandwidth, all the nations around the world have developed a fifth generation (5G) communication or a pre-5G communication system that is operated at a millimeter wave frequency (e.g., 28 to 86 GHz). The 5G communication system may provide flexible system structures and functions that allow various services having different requirements to be operated in a single system. As the 5G network using this may provide services having different requirements at the same time, electronic devices having various forms or various applications may be operated efficiently.

In the 5G communication system, the electronic device is operated at a millimeter wave frequency (e.g., 28 to 86 GHz), and an existing filter may not filter out a millimeter wave frequency. For example, an LC filter is one of the most widely used passive filter, and may be used as a filter by utilizing a resonance phenomenon through a series/parallel combination of inductance and capacitance components. The LC element has a small size and a light weight, and is inexpensive, but a parasite component of the LC element increases as frequency becomes higher with reference to a self-resonance frequency (SRF), and may not function as a filter any more as it loses the original element characteristics.

Further, a resistor and a capacitor are embedded in the interior of an electromagnetic interference (EMI) filter in the form of a packaged chip. The EMI filter may realize a low pass filter through combination of the components and has excellent EMI characteristics, but because the elements in the package are integrated at a wafer level, a parasite component is reduced and thus the magnetic resonance frequency of the EMI filter is higher than that of the LC filter but the EMI filter may function as a filter only at a band of 5 GHz or less.

In an inspection device (e.g., a shield box) that inspects the performance of an electronic device as well as in an electronic device that is operated at a millimeter wave frequency, an existing filter may not filter out a ultra-high band frequency. An electronic device may be disposed in the interior of a shield box, and a D-sub connector (e.g., a 25/9 pin) that connects the interior and the exterior of the shield box may be connected. When only the connector is used, an EMI interruption filter may be required because an external signal cannot be efficiently interrupted. The EMI interruption filter may be realized in a cable type by using a ferrite bead that is an inductor for removing EMIs at a high frequency or may be realized in a gender type by integrating a PCB, to which a chip capacitor is attached. However, the band for the filter materials and the used components is 6 GHz or less, and the EMI interruption filter can interrupt a frequency band of 6 GHz or less.

The above information is presented as background information only to assist with an understanding of the disclosure. No determination has been made, and no assertion is made, as to whether any of the above might be applicable as prior art with regard to the disclosure.

SUMMARY

According to the apparatus of various embodiments, because via group patterns are disposed in a main printed circuit board of an electronic device, they can be utilized as interruption filters that prevent a received or transmitted millimeter wave frequency signal from being coupled to an adjacent line to lower performance.

In the electronic device according to various embodiments, the band stop filter that interrupts at least some signals corresponding to a signal received from or transmitted to the antenna module may include a main printed circuit board disposed in via group patterns and an antenna module connected to the main printed circuit board.

In the printed circuit board according to various embodiments, the band stop filter that interrupts at least some signals received from or transmitted to the outside is disposed in via group patterns on the printed circuit board.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the disclosure and its advantages, reference is now made to the following description taken in conjunction with the accompanying drawings, in which like reference numerals represent like parts:

FIG. 5D is a view illustrating another example of via group patterns included in a band stop filter according to various embodiments;

DETAILED DESCRIPTION

Figure 1:
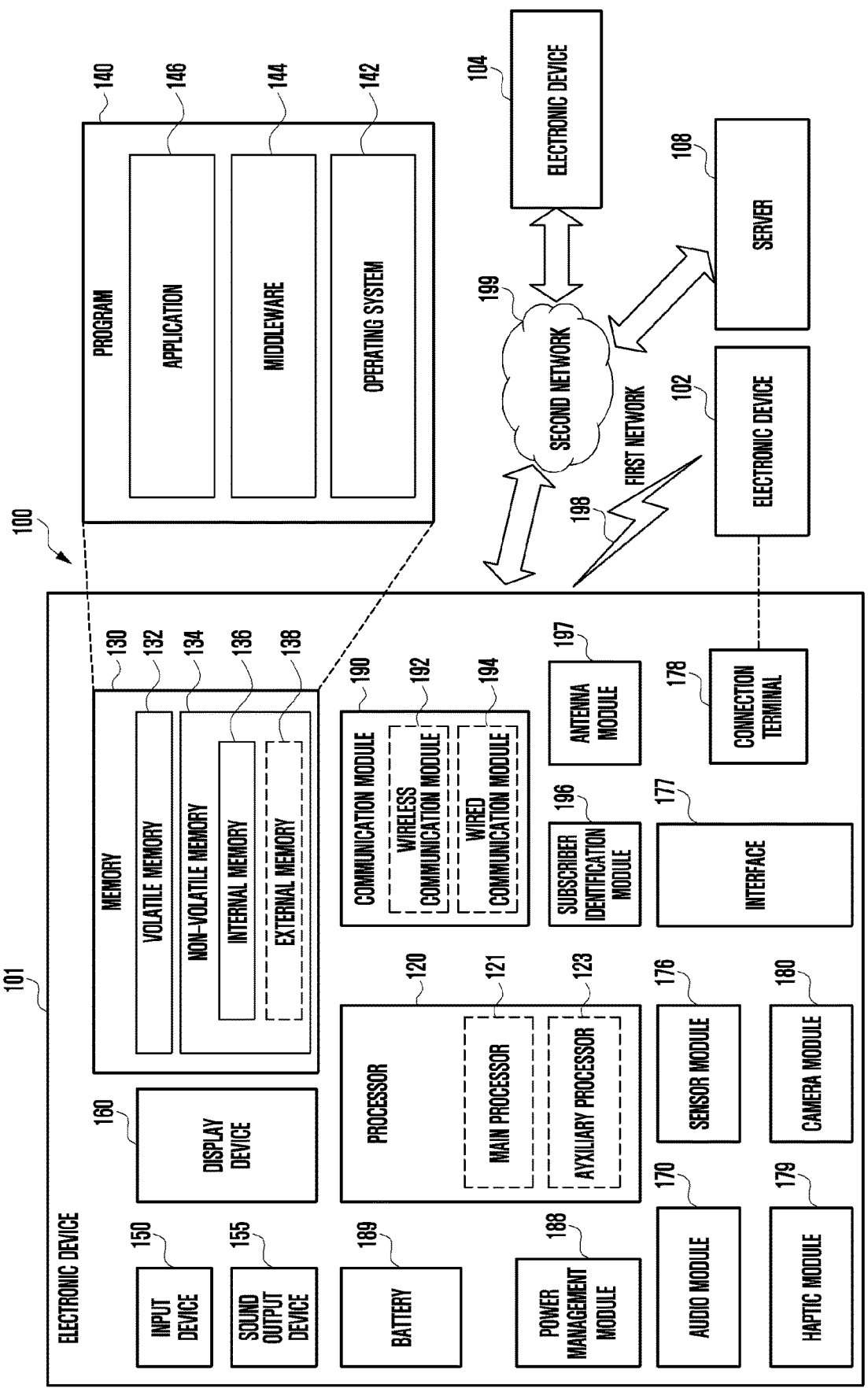
FIG. 1 illustrates a block diagram of an electronic device in a network environment according to various embodiments.

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The electronic device according to various embodiments may be one of various types of electronic devices. The electronic devices may include, for example, and without limitation, a portable communication device (e.g., a smart phone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wired), wirelessly, or via a third element.

As used herein, the term "module" may include a unit implemented in hardware, software, or firmware, or any combinations thereof and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
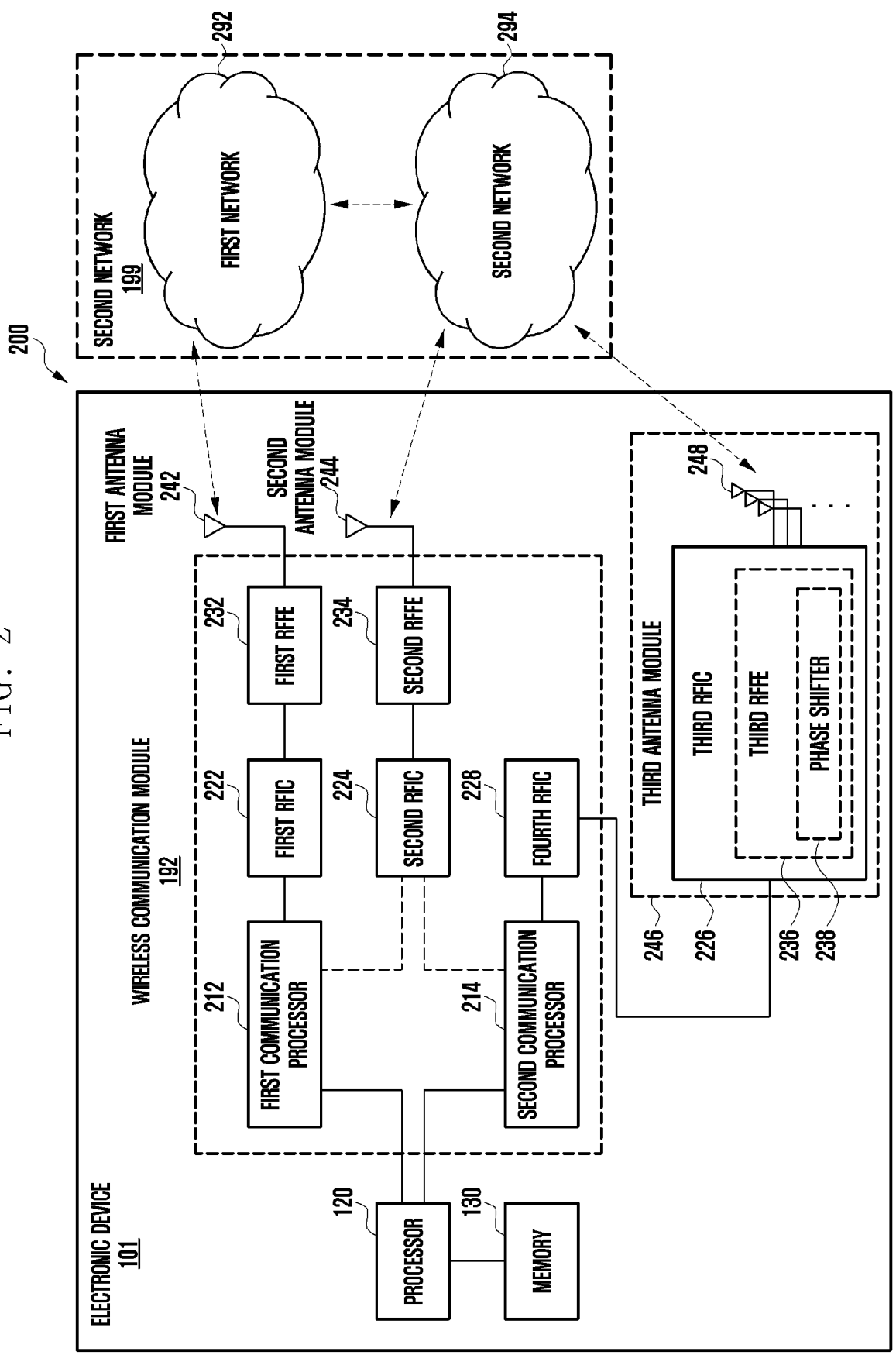
FIG. 2 is a block diagram of an electronic device for supporting a legacy network communication and a 5G network communication according to various embodiments.

FIG. 2 is a block diagram 200 illustrating an example electronic device 101 for supporting legacy network communication and 5G network communication according to various embodiments.

Referring to FIG. 2, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module (e.g., including at least one antenna) 242, a second antenna module (e.g., including at least one antenna) 244, and an antenna 248. The electronic device 101 may further include a processor (e.g., including processing circuitry) 120 and a memory 130.

The network 199 may include a first network (e.g., a legacy network) 292 and a second network (e.g., a 5G network) 294. According to another embodiment, the electronic device 101 may further include at least one component among the components illustrated in FIG. 1, and the network 199 may further include at least one different network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to another embodiment, the fourth RFIC 228 may be omitted or included as a part of the third RFIC 226.

The first communication processor 212 may include various communication processing circuitry and support establishment of a communication channel in a band to be used for wireless communication with the first network 292, and legacy network communication through the established communication channel. According to various embodiments, the first network may be a legacy network including, for example, and without limitation, a 2G, 3G, 4G, or long term evolution (LTE) network. The second communication processor 214 may support establishment of a communication channel corresponding to a designated band (for example, about 6 GHz to about 60 GHz) among bands to be used for wireless communication with the second network 294, and, for example, and without limitation, 5G network communication through the established communication channel. According to various embodiments, the second network 294 may, for example, be a 5G network as referenced by third generation partnership project (3GPP). Additionally, according to an embodiment, the first communication processor 212 or the second communication processor 214 may support establishment of a communication channel corresponding to another designated band (for example, about 6 GHz or lower) among the bands to be used for wireless communication with the second network 294, and, for example, 5G network communication through the established communication channel. According to an embodiment, the first communication processor 212 and the second communication processor 214 may be implemented inside a single chip or a single package. According to various embodiments, the first communication processor 212 or the second communication processor 214 may, for example, be provided inside a single chip or a single package together with a processor 120, an auxiliary processor 123, or a communication module 190.

The first RFIC 222 may convert a baseband signal generated by the first communication processor 212 into a radio frequency (RF) signal at about 700 MHz to about 3 GHz, which may be used for the first network 292 (for example, legacy network), during transmission. During reception, an RF signal may be acquired from the first network 292 (for example, legacy network) through an antenna (for example, the first antenna module 242), and may be preprocessed through an RFFE (for example, the first RFFE 232). The first RFIC 222 may convert the preprocessed RF signal into a baseband signal such that the same can be processed by the first communication processor 212.

The second RFIC 224 may convert a baseband signal generated by the first communication processor 212 or the second communication processor 214 into an RF signal in a Sub6 band (for example, about 6 GHz or lower) (hereinafter, referred to as a 5G Sub6 RF signal) that may be used for the second network 294 (for example, 5G network). During reception, a 5G Sub6 RF signal may be acquired from the second network 294 (for example, 5G network) through an antenna (for example, the second antenna module 244), and may be preprocessed through an RFFE (for example, the second RFFE 234). The second RFIC 224 may convert the preprocessed 5G Sub6 RF signal into a baseband signal such that the same can be processed by a communication processor corresponding to the first communication processor 212 or the second communication processor 214.

The third RFIC 226 may convert a baseband signal generated by the second communication processor 214 into an RF signal in a 5G Above6 band (for example, about 6 GHz to about 60 GHz) (hereinafter, referred to as a 5G Above6 signal) that is to be used for the second network 294 (for example, 5G network). During reception, a 5G Above6 RF signal may be acquired from the second network 294 (for example, 5G network) through an antenna (for example, the antenna 248), and may be preprocessed through the third RFFE 236. The third RFIC 226 may convert the preprocessed 5G Above6 signal into a baseband signal such that the same can be processed by the second communication processor 214. According to an embodiment, the third RFFE 236 may be formed as a part of the third RFIC 226.

According to an embodiment, the electronic device 101 may include a fourth RFIC 228 separately from the third RFIC 226 or as at least a part thereof. In this example, the fourth RFIC 228 may convert a baseband signal generated by the second communication processor 214 into an RF signal in an intermediate frequency band (for example, about 9 GHz to about 11 GHz) (hereinafter, referred to as an IF signal) and then deliver the IF signal to the third RFIC 226. The third RFIC 226 may convert the IF signal into a 5G Above6 RF signal. During reception, a 5G Above6 RF signal may be received from the second network 294 (for example, 5G network) through an antenna (for example, antenna 248) and converted into an IF signal by the third RFIC 226. The fourth RFIC 228 may convert the IF signal into a baseband signal such that the same can be processed by the second communication processor 214.

According to an embodiment, the first RIFC 222 and the second RFIC 224 may, for example, be implemented as at least a part of a single chip or a single package. According to an embodiment, the first RFFE 232 and the second RFFE 234 may, for example, be implemented as at least a part of a single chip or a single package. According to an embodiment, at least one antenna module of the first antenna module 242 or the second antenna module 244 may be omitted or coupled to another antenna module so as to process RF signal in multiple corresponding bands.

According to an embodiment, the third RFIC 226 and the antenna 248 may be arranged on the same substrate so as to form a third antenna module 246. For example, the wireless communication module 192 or the processor 120 may be arranged on a first substrate (for example, main PCB). In this example, the third RFIC 226 may be formed on a partial area (for example, lower surface) of a second substrate (for example, sub PCB) that is separate from the first substrate, and the antenna 248 may be arranged in another partial area (for example, upper surface), thereby forming a third antenna module 246. The third RFIC 226 and the antenna 248 may be arranged on the same substrate such that the length of the transmission line between the same can be reduced. This may reduce loss (for example, attenuation) of a signal in a high-frequency band (for example, about 6 GHz to about 60 GHz) used for 5G network communication, for example, due to the transmission line. Accordingly, the electronic device 101 may improve the quality or speed of communication with the second network 294 (for example, 5G network).

According to an embodiment, the antenna 248 may, for example, include an antenna array including multiple antenna elements that may be used for beamforming. In this example, the third RFIC 226 may include multiple phase shifters 238 corresponding to the multiple antenna elements, as a part of the third RFFE 236, for example. During transmission, each of the multiple phase shifters 238 may shift the phase of a 5G Above6 RF signal, which is to be transmitted to the outside (for example, base station of 5G network) of the electronic device 101, through a corresponding antenna element. During reception, each of the multiple phase shifters 238 may shift the phase of a 5G Above6 RF signal received from the outside into the same or substantially same phase through a corresponding antenna element. This enables transmission or reception through beamforming between the electronic device 101 and the outside.

The second network 294 (for example, 5G network) may be operated independently of the first network 292 (for example, legacy network) (for example, standalone (SA)), or operated while being connected thereto (for example, non-standalone (NSA)). For example, the 5G network may include an access network (for example, 5G radio access network (RAN) or next-generation network (NG RAN)) and may not include a core network (for example, next-generation core (NGC)). In this example, the electronic device 101 may access the access network of the 5G network and then access an external network (for example, Internet) under the control of the core network (for example, evolved packed core (EPC)) of the legacy network. Protocol information (for example, LTE protocol network) for communication with the legacy network or protocol information (for example, new radio (NR) protocol information) for communication with the 5G network may be stored in the memory 230, and may be accessed by another component (for example, the processor 120, the first communication processor 212, or the second communication processor 214).

Figure 3:
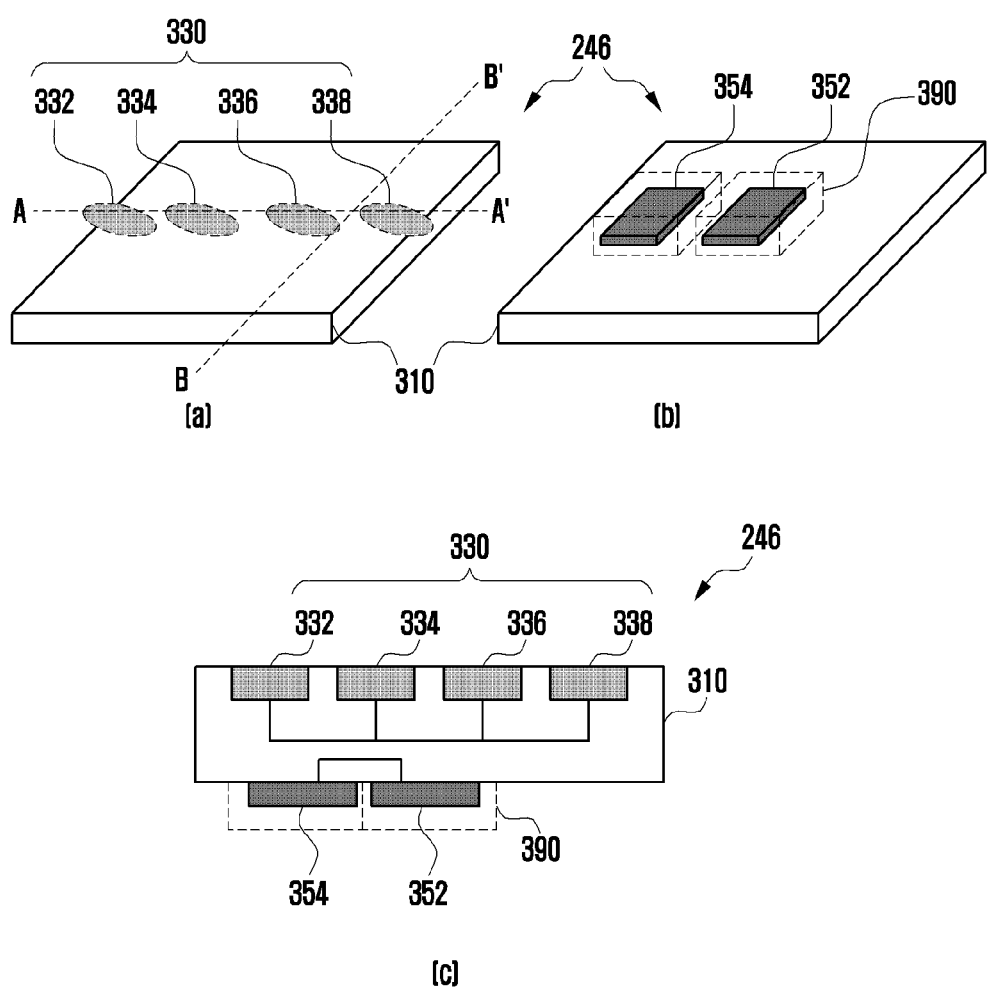
FIG. 3 illustrates an embodiment of a structure of a third antenna module of FIG. 2.

FIG. 3 illustrates an embodiment of a structure of a third antenna module 246 of FIG. 2. For reference, FIG. 3A is a perspective view of the third antenna module 246 viewed from one side, FIG. 3B is a perspective view of the third antenna module 246 viewed from another side, and FIG. 3C is a cross-sectional view of the third antenna module 246, taken along line A-A'.

Referring to FIG. 3, in an embodiment, the third antenna module 246 may include a printed circuit board 310, an antenna array 330, a radio frequency integrated circuit 352 (RFIC), a power management integrated circuit (PMIC) 354, and a module interface 370. Optionally, the third antenna module 246 may further include a shield member 390. In other embodiments, at least one of the above-mentioned components may be omitted or at least two of the components may be integrally formed.

The printed circuit board 310 may include a plurality of conductive layers and a plurality of nonconductive layers alternately laminated on the conductive layers. The printed circuit board 310 may provide electrical connections between various electronic components disposed in the printed circuit board 310 and/or on the outside by using wiring lines and conductive vias disposed on the conductive layers.

The antenna array 330 (e.g., 248 of FIG. 2) may include a plurality of antenna elements 332, 334, 336, or 338 disposed to form a directional beam. The antenna elements, as illustrated, may be disposed on a first surface of the printed circuit board 310. According to another embodiment, the antenna array 330 may be disposed in the interior of the printed circuit board 310. According to various embodiments, the antenna array 330 may include a plurality of antenna arrays (e.g., dipole antenna arrays and/or patch antenna arrays) of the same or different shapes or kinds.

The RFIC 352 (e.g., 226 of FIG. 2) may be disposed on another area (e.g., a second surface that is opposite to the first surface) of the printed circuit board 310, which is spaced apart from the antenna array. The RFIC 352 may be configured to process a signal of a selected frequency band, which is transmitted and received through the antenna array 330. According to an embodiment, the RFIC 352 may convert a baseband signal acquired from a communication processor (not illustrated) to an RF signal of a specific band when the baseband signal is transmitted. The RFIC 352 may convert the RF signal received through the antenna array 352 to a baseband signal and deliver the baseband signal to the communication processor when the RF signal is received.

According to another embodiment, the RFIC 352 may up-convert an IF signal (e.g., about 9 GHz to about 11 GHz) acquired from an intermediate frequency integrated circuit (IFIC) (e.g., 228 of FIG. 2) to an RF signal of a selected band when the IF signal is transmitted. The RFIC 352 may down-convert the RF signal acquired through the antenna array 352 to an IF signal and deliver the IF signal to the IFIC when the RF signal is received.

The PMIC 354 may be disposed in another partial area (e.g., the second surface) of the printed circuit board 310, which is spaced apart from the antenna array. The PMIC may receive a voltage from the main PCB (not illustrated), and may provide electric power that is necessary for various components (e.g., the RFIC 352) on the antenna module.

The shield member 390 may be disposed at a portion (e.g., the second surface) of the printed circuit board 310 to electromagnetically shield at least one of the RFIC 352 or the PMIC 354. According to an embodiment, the shield member 390 may include a shield can.

Although not illustrated, in various embodiments, the third antenna module 246 may be electrically connected to another printed circuit board (e.g., the main circuit board) through a module interface. The module interface may include a connection member, for example, a coaxial cable connector, a board-to-board connector, an interposer, or a flexible printed circuit board (FPCB). Through the connection member, the RFIC 352 and/or the PMIC 354 of the antenna module may be electrically connected to the printed circuit board.

Figure 4:
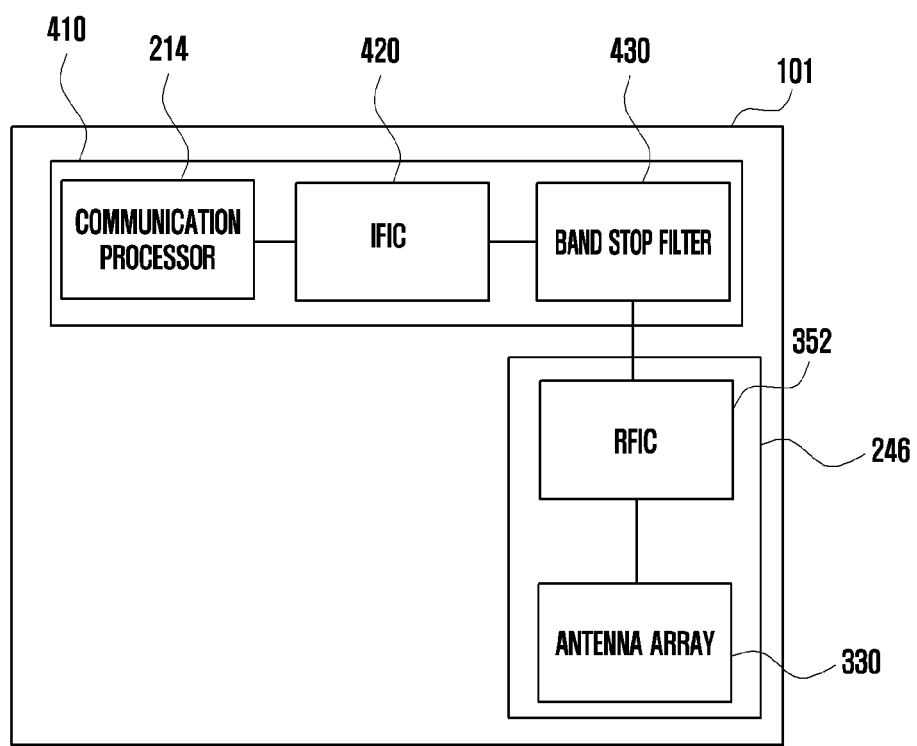
FIG. 4 is a block diagram of an electronic device including a PCB embedded filter having via group patterns according to various embodiments.

FIG. 4 is a block diagram of an electronic device including a PCB embedded filter having via group patterns according to various embodiments.

Referring to FIG. 4, an electronic device (e.g., the electronic device 101 of FIG. 1) according to various embodiments may include a main printed circuit board 410 and an antenna module (e.g., the third antenna module 246 of FIGS. 2 and 3). The main printed circuit board 410 may include a communication processor (e.g., the second communication processor 214 of FIG. 2), an intermediate frequency integrated circuit (IFIC) 420, or a band stop filter 430. The third antenna module 246 may include an RFIC (e.g., the third RFIC 226 of FIG. 2 or the RFIC 352 of FIG. 3) or an antenna array (e.g., the antenna 248 of FIG. 2 or the antenna array 330 of FIG. 3). The main printed circuit board 410 and the third antenna module 246 may be electrically connected to each other through a module interface. The module interface may include a connection member, for example, a coaxial cable connector, a serial peripheral interface (SPI) connector, a board-to-board connector, an interposer, or an FPCB.

Although not illustrated, the main printed circuit board 410 may include a plurality of conductive layers and a plurality of nonconductive layers alternately laminated on the conductive layers. Electronic components such as a memory (e.g., the memory 130 of FIG. 1) or a processor (e.g., the processor 120 of FIG. 1) may be further mounted (included) on the main printed circuit board 410. The main printed circuit board 410 may provide electrical connections between various electronic components disposed in the main printed circuit board 410 and/or on the outside by using wiring lines and conductive vias disposed on the conductive layers.

According to various embodiments, as illustrated in FIG. 3, the third antenna module 246 may include a printed circuit board 310, an antenna array 330, a radio frequency integrated circuit 352 (RFIC), a power management integrated circuit 354, and a module interface 370. The RFIC 352 and the antenna array 330 may be mounted on opposite surfaces of the third antenna module 246. Although FIG. 4 illustrates that the electronic device 101 includes one constituent element (e.g., the second communication processor 214, the IFIC 420, the band stop filter 430, the RFIC 352, or the antenna array 330), respectively, the electronic device 101 may include one or more elements as in FIG. 2.

The band stop filter 430 may be disposed close to a location connected to the third antenna module 246. The band stop filter 430 can prevent frequency interferences with a signal received or transmitted through the third antenna module 246. For example, the frequency used in a 5G communication system is a millimeter wave frequency (e.g., 28 to 86 GHz), and the band stop filter 430 can prevent a signal transmitted and received as a millimeter wave frequency from being coupled to the third antenna module 246 and a power source of a digital terminal, thereby preventing deterioration of performance. For example, when the electronic device 101 transmits a signal to the outside, an input terminal of the band stop filter 430 may be the IFIC 420 and an output terminal of the band stop filter 430 may be the RFIC 352. When the electronic device 101 receives a signal to the outside, an input terminal of the band stop filter 430 may be the RFIC 352 and an output terminal of the band stop filter 430 may be the IFIC 420.

For example, a millimeter wave frequency (e.g., a 28 GHz or 39 GHz) signal may be input to the RFIC 352 through the antenna array 330, and may be changed to an intermediate frequency (IF) data signal of 11 GHz or 6 GHz via a down-converter. When a signal is transmitted or received through the antenna array 330, the intensity of the signal is high and thus may be induced in an adjacent signal line. The band stop filter 430 may be disposed between the IFIC 420 and the RFIC 352 and can prevent the transmitted or received signal from being induced in the adjacent signal line.

The band stop filter 430 may be disposed in via group patterns in the main printed circuit board 410. The via group patterns may mean not that a plurality of vias (or via holes) are dispersed (or distributed) but that a plurality of vias are collected in groups. One via included in the via group patterns may be operated as one LC filter. Because one LC filter cannot stop a millimeter wave frequency, one or more LC filters may be necessary. To achieve this, the via group patterns may include one or more vias. The frequency bands that are stopped may become different according to at least the lengths of vias, the diameters of signal lines in the vias, or gaps in the vias.

A signal lines that passes through at least a portion of a via may be disposed in the interior of the via. The signal line may have a second diameter that is smaller than the first diameter of the via, and may be disposed at the dead center of the via. The first diameter may mean the diameter of the via, and the second diameter may mean the thickness (or width) of the signal line. The second diameter may be disposed variously according to the thickness of the signal line. The gap in the via may mean a space between the first diameter and the second diameter. Because the signal line is disposed at the center of the first diameter of the via, the gap may be disposed on opposite sides of the signal line.

According to various embodiments, when the first diameter of the via is determined, the width of the gap may be determined according to the second diameter. The length of the via and the width of the second diameter may influence inductance, and the width of the gap may influence capacitance. A band, at which a frequency is stopped by an LC filter, may become different according to at least one of the length of the via, the width of the diameter, or the width of the gap. According to various embodiments, at least the number of vias, the lengths of the vias, the diameters of signal lines in the vias, or gaps in the vias may be determined in consideration of an inductance and a capacitance that are necessary for the band stop filter to be operated as an LC filter.

The main printed circuit board 410 may have multiple layers, and a plurality of electronic components (e.g.; the processor 120 or the memory 130) that are necessary for an operation of the electronic device 101 may be mounted on the main printed circuit board 410. The lengths of the vias may become different according to the number of the layers laminated on the main printed circuit board 410. According to various embodiments, the gaps in the vias, the lengths of the vias, and the diameters (e.g., the second diameter) of the signal lines in the vias may influence inductance and capacitance more in that sequence. The band stop filter 430 may determine the diameter of the signal line in an optimum via based on the number of the vias, and may determine the length of the via or the gap in the via based on the determined diameter of the signal line.

Figure 5A:
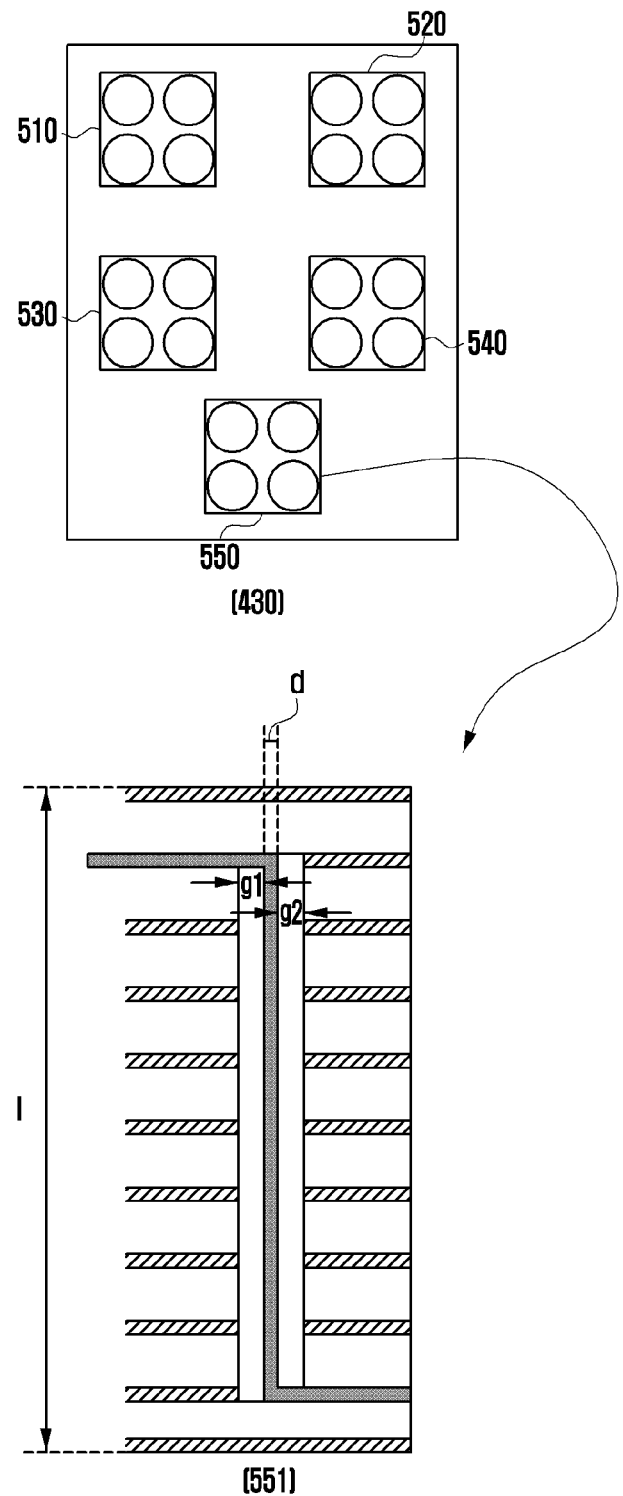
FIG. 5A is a view illustrating an example of a band stop filter according to various embodiments.

FIG. 5A is a view illustrating an example of a band stop filter according to various embodiments.

Referring to FIG. 5A, a band stop filter (e.g., the band stop filter 430 of FIG. 4) according to various embodiments may determine the number of via group patterns based on a signal line connected to a third antenna module (e.g., the third antenna module 246 of FIGS. 3 and 4). For example, the band stop filter 430 may be connected to the third antenna module 246 by an SPI connector, and the SPI connector may include five signal lines (e.g., VDD, GND, DATA, CLK, and EN (CONT)). The band stop filter 430 may include first to fifth via group patterns 510, 520, 530, 540, and 550. The first via group pattern 510 may be connected to a first signal line (e.g., DATA) of the SPI connector, the second via group pattern 520 may be connected to a second signal line (e.g., VDD) of the SPI connector, the third via group pattern 530 may be connected to a third signal line (e.g., GND) of the SPI connector, the fourth via group pattern 540 may be connected to a fourth signal line (e.g., CLK) of the SPI connector, and the fifth via group pattern 550 may be connected to a fifth signal line (e.g., EN) of the SPI connector, According to various embodiments, FIG. 5 illustrates an example of the via group patterns being connected to the SPI connector, and when the via group patterns are connected to the third antenna module 246 by a coaxial cable connector, the band stop filter 430 may include one via group pattern (e.g., the first via group pattern 510). The coaxial cable connector may include one signal line (e.g., DATA), and one via group pattern of the band stop filter 430 may be connected a signal line DATA of the coaxial cable connector.

In the first to fifth via group patterns 510 to 550, at least the number of the vias, the lengths of the vias, the diameters of the signal lines in the vias, or the gaps in the vias may be the same or different. Further, in the first to fifth via group patterns 510 to 550, at least the number of the vias, the lengths of the vias, the diameters of the signal lines in the vias, or the gaps in the vias may be the same or different, based on the kind of the connected signal line.

According to various embodiments, the number of the vias included in each of the first to fifth via group patterns 510 to 550 may be determined according to the number of the layers (or the lengths of the vias) of the main printed circuit board 410 or the millimeter wave frequency band. Although FIG. 5A illustrates that four vias are inclined in the first to fifth via group patterns 510 to 550, the number of the vias may be larger or smaller than four. The above description has been made for helping understanding of the disclosure, but the disclosure is not limited by the description. Further, the number of the vias included in each of the first to fifth via group patterns 510 to 550 may become different according to the connector connected to the third antenna module 246. When being connected to the third antenna module 246 by an SPI connector, one via group pattern may have three or not more than five vias. When being connected to the third antenna module 246 by a coaxial cable connector, one via group pattern may have at least not less than five vias.

When the main printed circuit board 410 has twelve layers, one via 521 passes through the layers (e.g., the second to eleventh layers) except for the first layer or the twelfth layer. The length 1 of the via 521 may mean the length (or the vertical length) of the hole that passes through the layers. Although not illustrated, the main printed circuit board 410 may include a plurality of conductive layers (e.g., the metallic layers) and a plurality of nonconductive layers (e.g., the insulation layers) alternately laminated on the conductive layers. The diameter d of the signal line in the via 521 may mean a second diameter that is smaller than the first diameter of the hole that passes through the layers. The first diameter of the hole that passes through the layers is the diameter of the via, and the second diameter may mean the thickness of the signal line that passes through at least a portion of the via. The signal line may be disposed at the dead center of the via, and may have a second diameter that is smaller than the first diameter of the via. The second diameter may be disposed variously according to the thickness of the signal line.

The gap g in the via may mean a space between the first diameter and the second diameter. Because the signal line is disposed at the center of the first diameter of the via, the gap may be disposed on opposite sides (e.g., g1 and g2) of the signal line. Although it is illustrated in the drawing that the via 521 passes through the layers except for the first layer or the twelfth layer, the via 521 may pass through the first to twelfth layers or may pass through some layers (e.g., the third to tenth layers, the fourth to twelfth layers, or the like). Because forming the via 521 such that the via 521 passes through any layer is related to the length of the via, the length of the via may be determined in consideration of the inductance and the capacitance of the LC circuit.

Figure 5B:
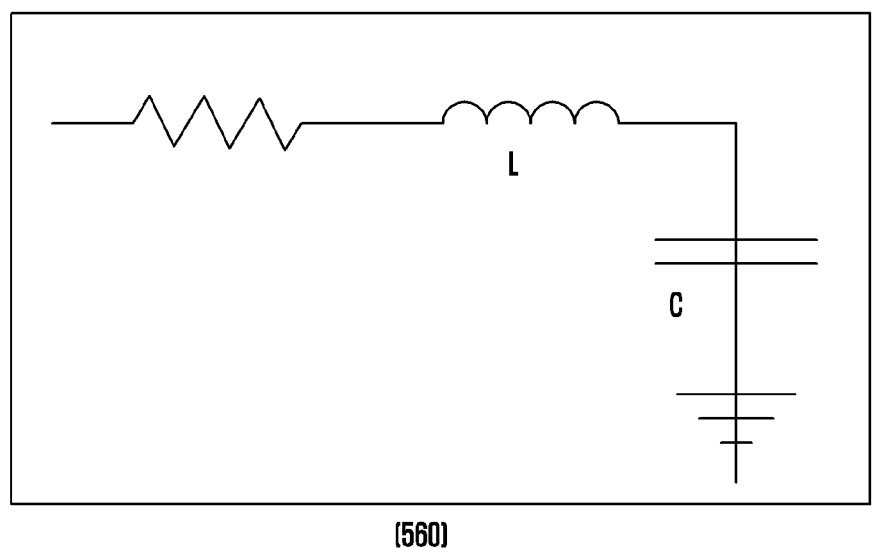
FIG. 5B is a view illustrating a circuit configuration and a frequency interruption graph of a band stop filter according to various embodiments.
Figure 5B:
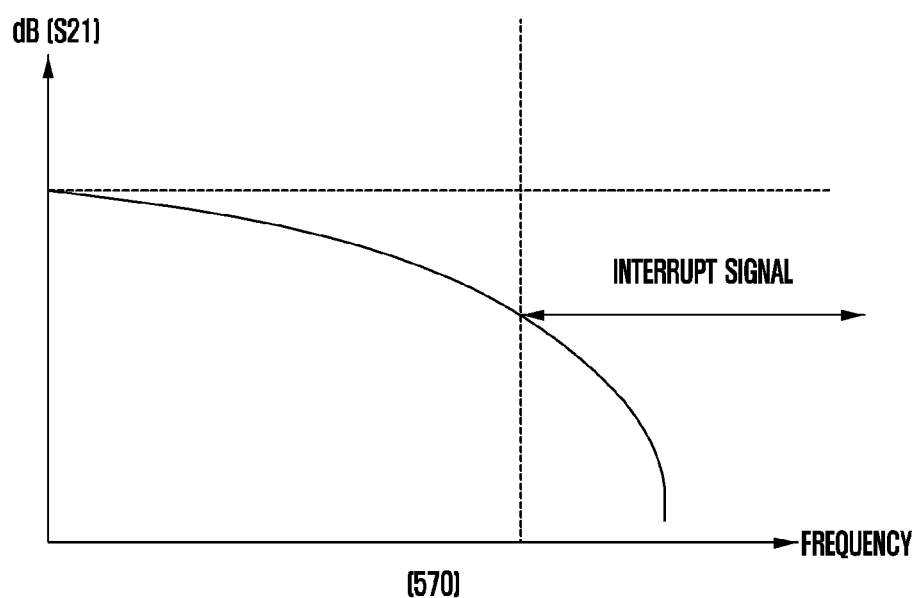

FIG. 5B is a view illustrating a circuit configuration and a frequency interruption graph of a band stop filter according to various embodiments.

Referring to FIG. 5B, one via included in the band stop filter 430 according to various embodiments may be operated as one LC filter 560. With reference to the frequency interruption graph 570, one LC filter 560 may interrupt only a signal of a frequency band of 3 GHz or less. When a plurality of LC filters 560 are connected to each other in parallel, a millimeter wave frequency can be interrupted. In consideration of the frequency characteristics, the band stop filter 430 may be formed of via group patterns including one or more vias. According to various embodiments, the gaps in the vias, the lengths of the vias, and the diameters of the signal lines in the vias may influence inductance and capacitance in that sequence. The band stop filter 430 may determine the diameter of the signal line in an optimum via based on the number of the vias, and may determine the length of the via or the gap in the via based on the determined diameter of the signal line.

Figure 5C:
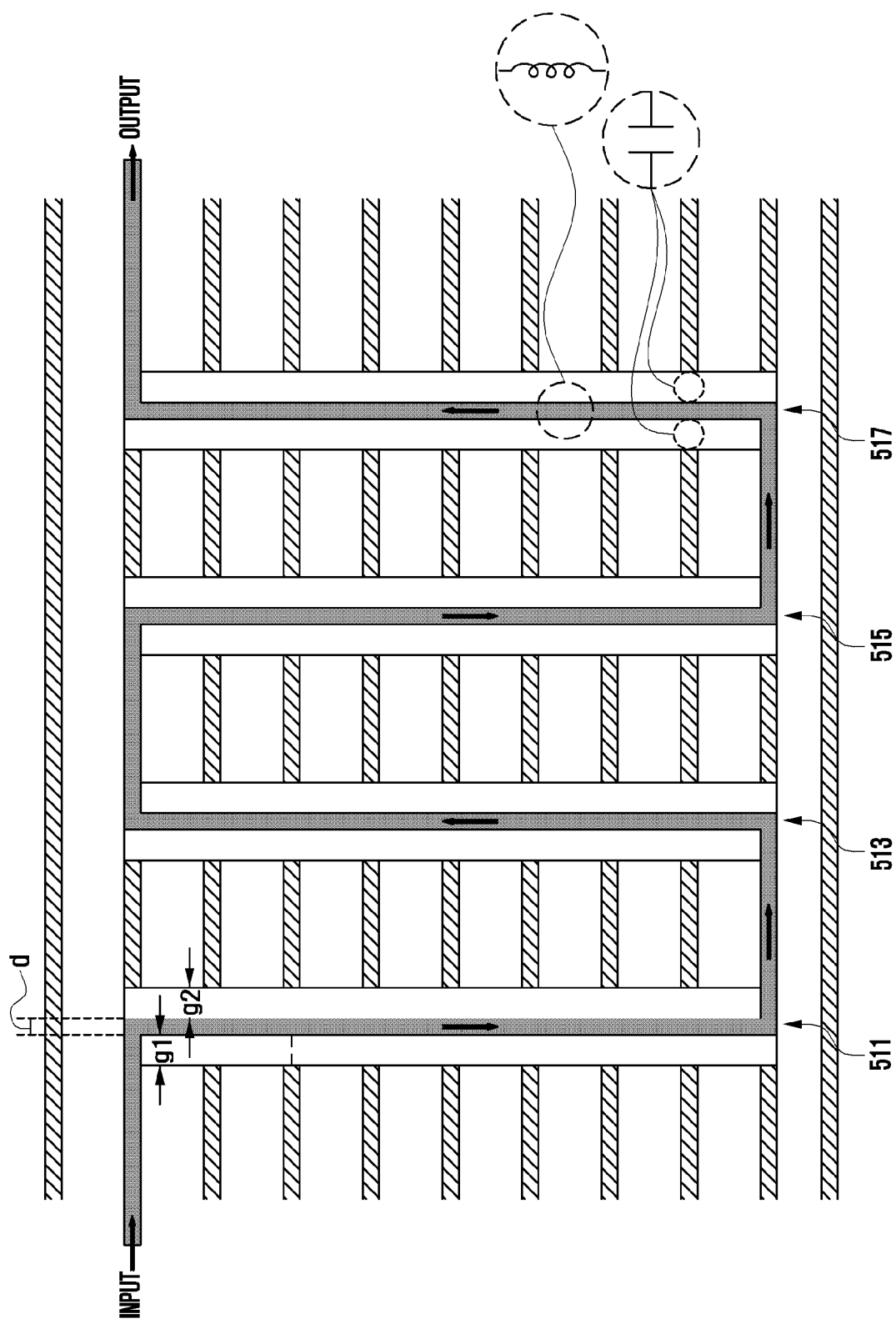
FIG. 5C is a view illustrating an example of via group patterns included in a band stop filter according to various embodiments.

FIG. 5C is a view illustrating an example of via group patterns included in a band stop filter according to various embodiments.

Referring to FIG. 5C, a first via group pattern 510 of the band stop filter 430 according to various embodiments may include four vias. A signal input to a first via 511 may be output via a second via 513, a third via 515, or a fourth via 517. A signal input to the first via 511 may be output via a third via 515, the second via 513, or the fourth via 517. A signal input to the fourth via 517 may be output via the third via 515, the second via 513, or the first via 511. A signal input to the fourth via 517 may be output via the second via 513, the third via 515, or the first via 511. According to various embodiments, a via to which a signal is input and a via from which a signal is output may be determined in the first group pattern 510, but it may become different whether a signal is output via a middle via (e.g., the second via 513 or the third via 515) internally according to a conductive (or connection) state of the vias.

For example, when the electronic device 101 transmits a signal to the outside, a signal input from the IFIC 420 may be input through the first via 511 and output to the fourth via 517, and may be delivered to the RFIC 352. When the electronic device 101 receives a signal from the outside, a signal input from the RFIC 352 may be input through the fourth via 517 and output to the first via 511, and may be delivered to the IFIC 420.

FIG. 5C illustrates that the lengths (e.g., the number of layers, through which a hole passes) of the first via 511, the second via 513, the third via 515, and the fourth via 517, the diameters of the signal lines (e.g., a shadowed part) in the vias, and the gaps in the vias are the same, but the lengths of the vias, the diameters of the signal lines, or the gaps in the vias may be different. The lengths of the vias and the widths of the diameters of the signal lines influence inductance and the widths of the gaps influence capacitance, and a band, at which a frequency is stopped by an LC filter, may become different according to at least one of the lengths of the vias, the widths of the diameters, or the widths of the gaps. For example, an inductance substance may be formed according to the signal line, and a capacitance substance may be formed between the metallic layer (e.g., a hatched part) of the main printed circuit board 410 and the signal line (e.g., g1 or g2). For example, because the gaps in the vias, the lengths of the vias, the diameters of the signal lines in the vias may influence inductance and capacitance more in that sequence, the lengths of the vias or the diameters of the signal lines in the vias can be adjusted while the gaps in the vias are fixed.

FIG. 5D is a view illustrating another example of via group patterns included in a band stop filter according to various embodiments.

Referring to FIG. 5D, the second via group pattern 520 of the band stop filter 430 according to various embodiments may include four vias. A signal input to a first via 521 may be output via a second via 523, a third via 525, or a fourth via 527. A signal input to the first via 521 may be output via a third via 525, the second via 523, or the fourth via 527. According to various embodiments, a via to which a signal is input and a via from which a signal is output may be determined in the first group pattern 520, but it may become different whether a signal is output via a middle via (e.g., the second via 523 or the third via 525) internally according to a conductive (or connection) state of the vias.

According to various embodiments, the main printed circuit board 410 may be realized by twelve layers, and when a signal, a power, and a GND are present around the eighth to twelfth layers of the main printed circuit board 410, the via group patterns may be disposed while detouring the eighth to twelfth layers. For example, the lengths of the vias in the second via group pattern 520, the diameters of the signal lines, or the gaps in the vias may be disposed differently. A signal may be input to the first via 521 through the second layer, the second via 523 may receive a signal from the first via 521 through the seventh layer, the third via 525 may receive a signal from the second via 523 through the third layer, and the fourth via 527 may receive a signal from the third via 525 through the eighth layer. The vias may pass through all the layers of the main printed circuit board 410 (e.g., FIG. 5C), or may pass through some of the layers (e.g., FIG. 5D).

Figure 6A:
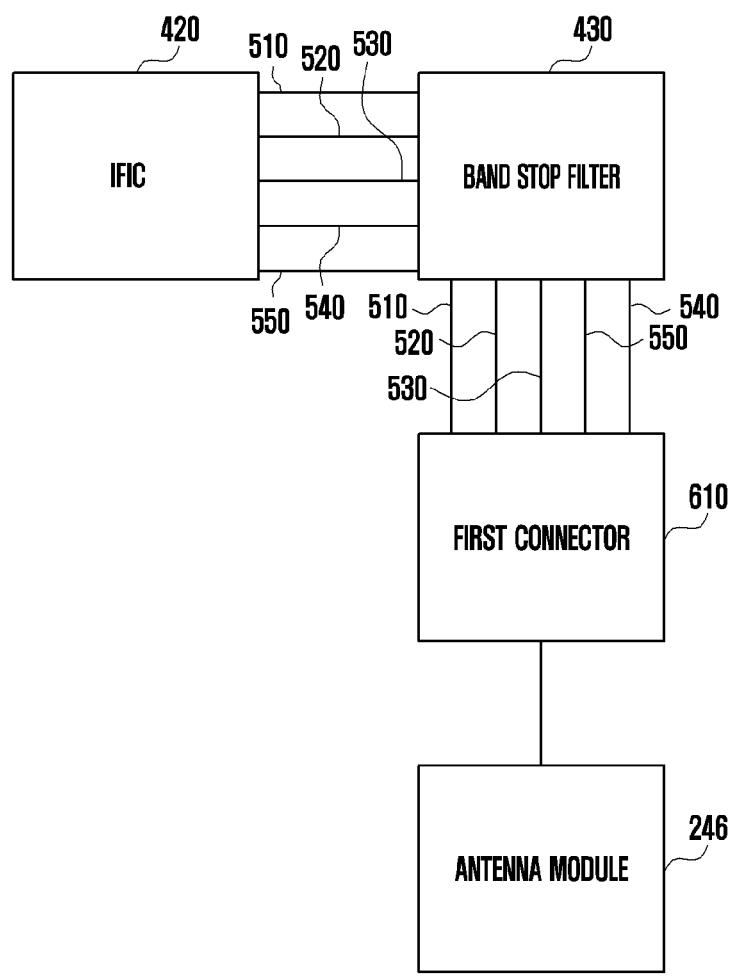
FIG. 6A is a view illustrating an example of connecting a band stop filter and an antenna module with a first connector according to various embodiments.

FIG. 6A is a view illustrating an example of connecting a band stop filter and an antenna module with a first connector according to various embodiments.

Referring to FIG. 6A, a main printed circuit board (e.g., the main printed circuit board 410 of FIG. 4) according to various embodiments and an antenna module (e.g., the third antenna module 246 of FIGS. 3 and 4) may be connected to each other by the first connector 610. A band stop filter (e.g., the band stop filter 430 of FIG. 4) may be formed in via group patterns at an adjacent location at which the first connector 610 is connected to the main printed circuit board 410. The first connector 610 may mean an SPI connector, and the SPI connector may include five signal lines (e.g., VDD, GND, DATA, CLK, and EN (CONT)). The band stop filter 430 may include first to fifth via group patterns (e.g., 510, 520, 530, 540, and 550 of FIG. 5). The first via group pattern 510 may be connected to a first signal line (e.g., DATA) of the first connector 610, the second via group pattern 520 may be connected to a second signal line (e.g., VDD) of the first connector 610, the third via group pattern 530 may be connected to a third signal line (e.g., GND) of the first connector 610, the fourth via group pattern 540 may be connected to a fourth signal line (e.g., CLK) of the first connector 610, and the fifth via group pattern 550 may be connected to a fifth signal line (e.g., EN) of the first connector 610, FIG. 6B is a view illustrating an example of via group patterns according to signal lines of a band stop filter according to various embodiments.

Figure 6B:
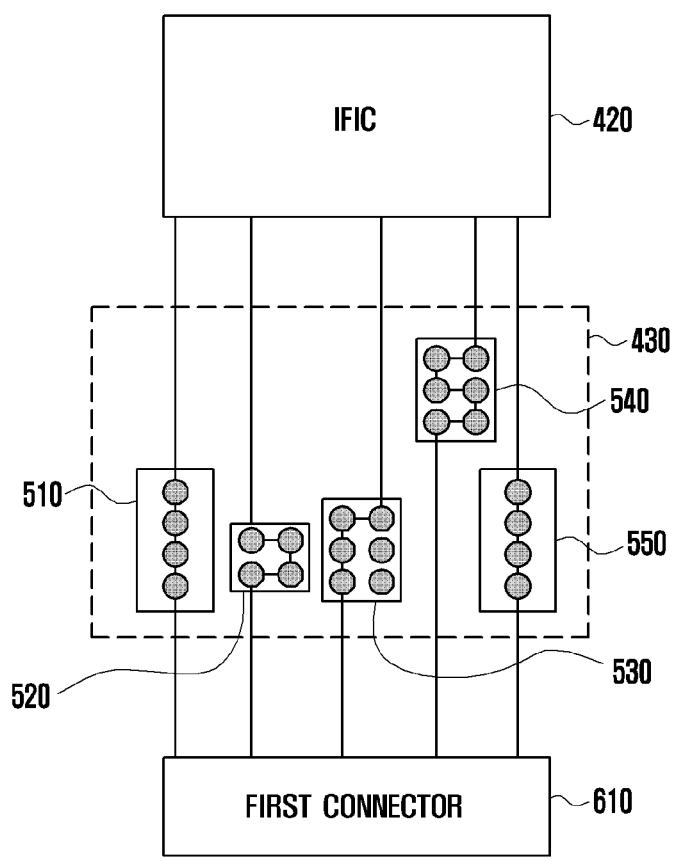
FIG. 6B is a view illustrating an example of via group patterns according to signal lines of a band stop filter according to various embodiments.

Referring to FIG. 6B, in a band stop filter (e.g., the band stop filter 430 of FIG. 4) according to various embodiments, the number of vias in a via group pattern or via forming patterns may be different according to a signal line. Further, at least the lengths of the vias in the via group patterns, the diameters of the signal lines, or the gaps in the vias may be different according to the signal line. For example, a first via group pattern 510 connected to a first signal line DATA may have four vias, and the vias may be formed vertically. A second via pattern 520 connected to a second signal line VDD may have four vias, and two vias may be disposed in parallel horizontally. A third via pattern 530 connected to a third signal line GND may have four vias, and two vias may be disposed in parallel horizontally and the remaining two vias may be disposed to be perpendicular to the other vias. A fourth via pattern 540 connected to a fourth signal line CLK may have six vias, and two vias may be disposed in parallel horizontally and the signal lines in the vias may be disposed such that a signal is output to a lower via two vias disposed in parallel. A fifth via group pattern 540 connected to a fifth signal line EN may have four vias, and the vias may be formed vertically.

Figure 6C:
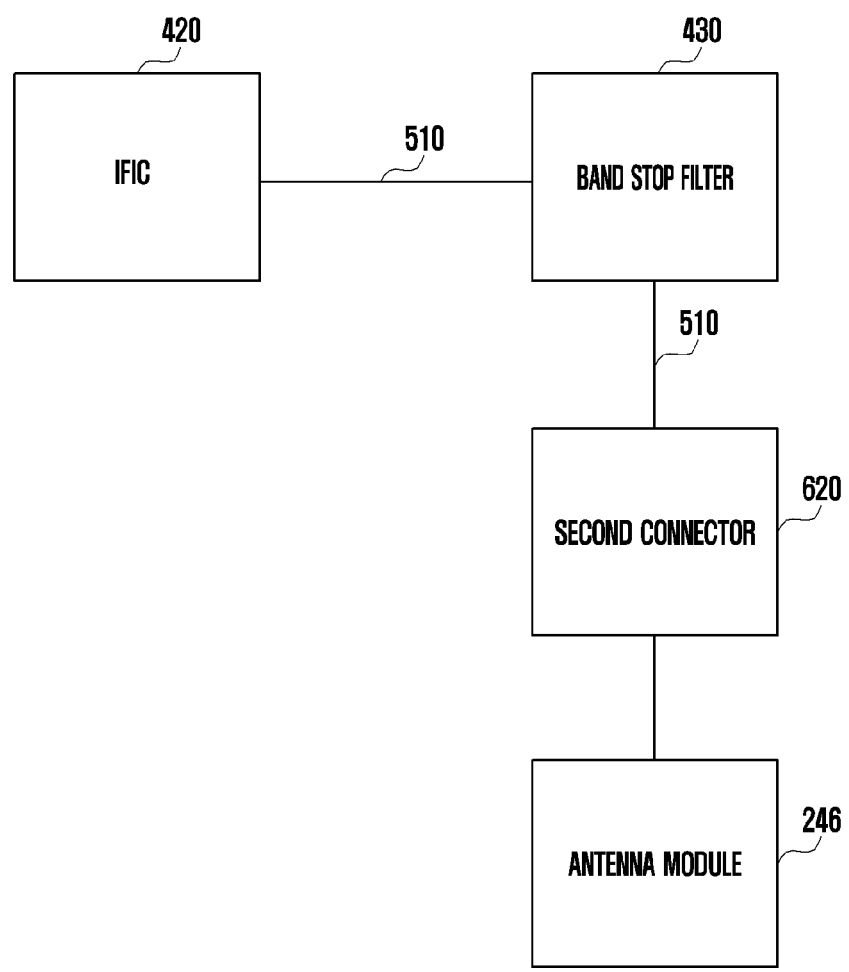
FIG. 6C is a view illustrating an example of connecting a band stop filter and an antenna module with a second connector according to various embodiments.

FIG. 6C is a view illustrating an example of connecting a band stop filter and an antenna module with a second connector according to various embodiments.

Referring to FIG. 6C, a main printed circuit board 410 according to various embodiments and a third antenna module 246 may be connected to each other by a second connector 620. A band stop filter (e.g., the band stop filter 430 of FIG. 4) may be formed in via group patterns at an adjacent location at which the second connector 620 is connected to the main printed circuit board 410. The second connector 620 may mean a coaxial cable connector, and the coaxial cable connector may include one signal line (e.g., DATA). In this case, the band stop filter 430 may include one via group pattern (e.g., the first via group pattern 510). The first via group pattern 510 may be connected to the first signal line (e.g., DATA) of the second connector 620. When the band stop filter 430 is connected to the coaxial cable connector, at least the number of the vias included in the band stop filter 430, the lengths of the vias, the diameters of the signal lines in the vias, or the gaps in the vias may be the same as or different from at least the number of the vias included in the band stop filter 430 when the band stop filter 430 is connected to the SPI connector, the lengths of the vias, the diameters of the signal lines in the vias, or the gaps in the vias.

Figure 7A:
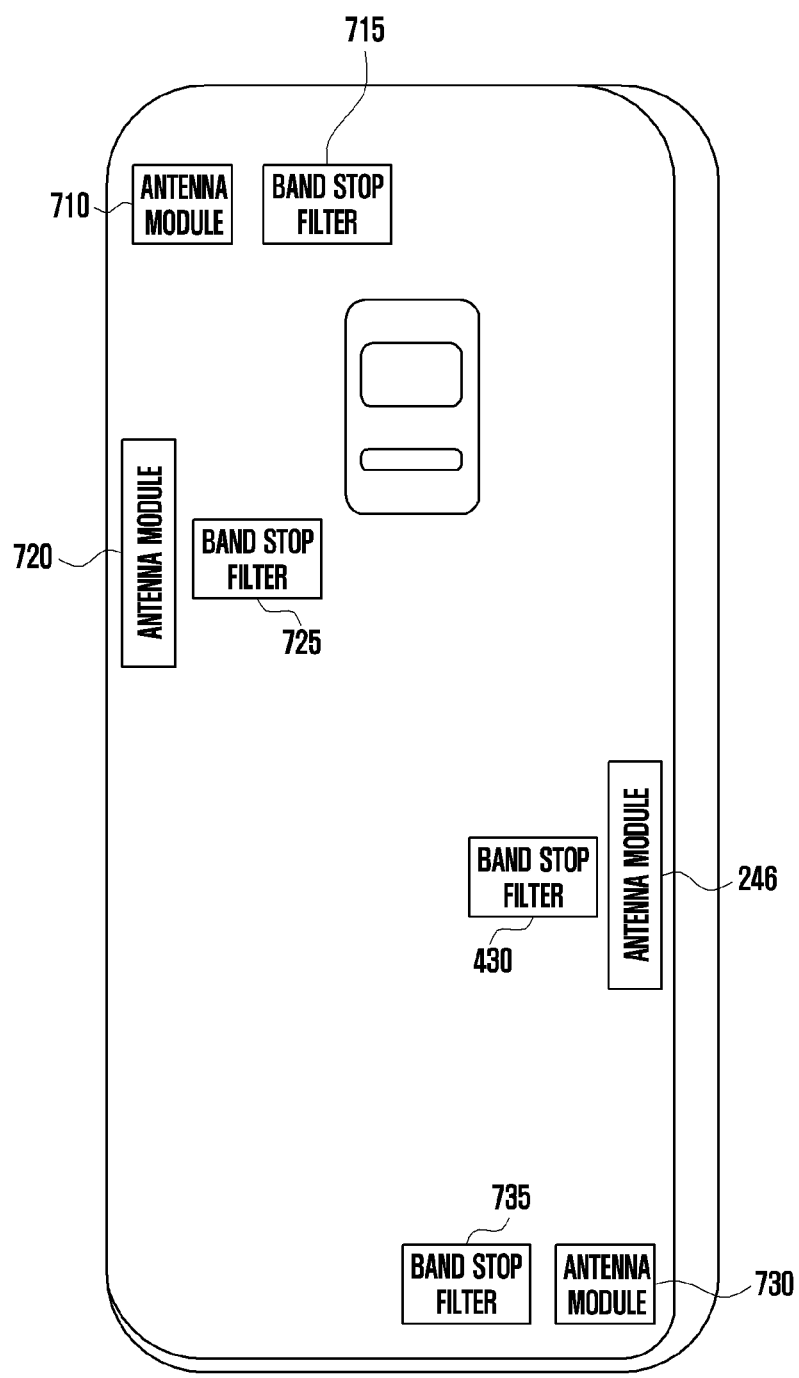
FIG. 7A is a view illustrating arrangement of an antenna module and a band stop filter of an electronic device according to various embodiments.

FIG. 7A is a view illustrating arrangement of an antenna module and a band stop filter of an electronic device according to various embodiments.

Referring to FIG. 7A, an electronic device (e.g., the electronic device 101 of FIG. 1) according to various embodiments may include a first antenna module 710, a first band stop filter 715, a second antenna module 720, a second band stop filter 725, a third antenna module (e.g., the third antenna module 246 of FIGS. 3 and 4), a third band stop filter (e.g., the band stop filter 430 of FIG. 4), a fourth antenna module 730, or a fourth band stop filter 735. The band stop filters (e.g., 430, 715, 725, and 735) is adapted to prevent frequency interferences occurring due to a transmitted or received signal, and may be paired with the antenna modules (e.g., 246, 710, 720, and 730). Further, the band stop filters (e.g., 430, 715, 725, and 735) may be disposed at a location that is adjacent to the locations of the antenna modules (e.g., 246, 710, 720, and 730).

The first band stop filter 715 may be disposed in via group patterns in the main printed circuit board (e.g., the main printed circuit board 410 of FIG. 4) that is close (adjacent) to the location at which the first band stop filter 715 is connected to the first antenna module 710. The second band stop filter 725 may be disposed in via group patterns in the main printed circuit board 410 that is adjacent to the location at which the second band stop filter 725 is connected to the second antenna module 720. The third band stop filter 430 may be disposed in via group patterns in the main printed circuit board 410 that is adjacent to the location at which the third band stop filter 430 is connected to the third antenna module 246. The fourth band stop filter 735 may be disposed in via group patterns in the main printed circuit board 410 that is adjacent to the location at which the fourth band stop filter 735 is connected to the fourth antenna module 730.

According to various embodiments, the first antenna module 710 or the fourth antenna module 730 may be laid on the rear surface of the electronic device 101. The first antenna module 710 or the fourth antenna module 730 may be disposed at symmetrical locations when the electronic device 101 is viewed in a height direction. The first antenna module 710 or the fourth antenna module 730 may mean the first antenna module 242 of FIG. 2. The first antenna module 710 may include the first RFIC 222 or the first antenna module 242. The fourth antenna module 730 may include the second RFIC 224 or the second antenna module 244. The second antenna module 720 or the third antenna module 246 may be disposed uprights on a side surface of the electronic device 101. A side surface of the electronic device 101 is a surface to which the front surface and the rear surface of the electronic device 101 are connected at a regular interval, and for example, may be a surface on which a soft key (e.g., a volume button) is disposed.

Although FIG. 7A illustrates that the electronic device 101 includes four antenna modules or band stop filters, the electronic device 101 may include two or more antenna modules or band stop filters.

Figure 7B:
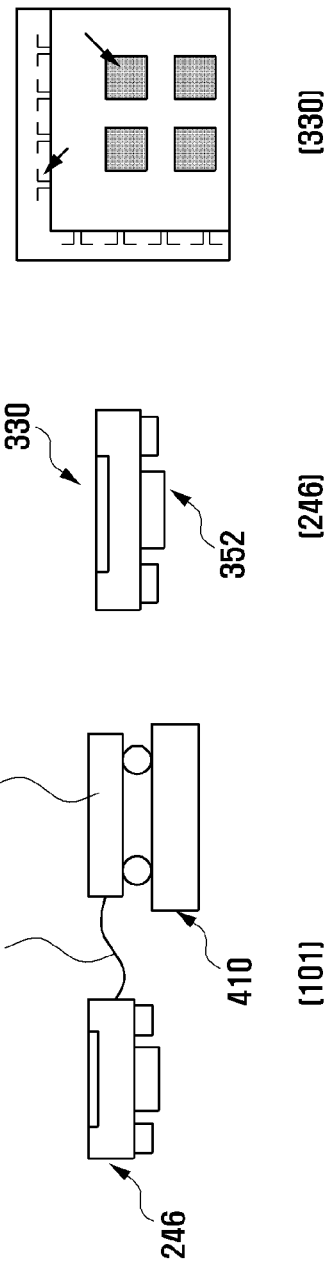
FIG. 7B is a cross-sectional view of an antenna module and a band stop filter of an electronic device according to various embodiments.

FIG. 7B is a cross-sectional view of an antenna module and a band stop filter of an electronic device according to various embodiments.

Referring to FIG. 7B, an electronic device (e.g., the electronic device 101 of FIG. 1) according to various embodiments may include a main printed circuit board (e.g., the main printed circuit board 410 of FIG. 4), a communication processor (e.g., the second communication processor 214 of FIG. 2), an IFIC 420, or a band stop filter 430. The main printed circuit board 410 may be connected to an antenna module (e.g., the third antenna module 246 of FIG. 4) through a connector (e.g., the first connector 610 or the second connector 620 of FIG. 6). The third antenna module 246 may include an RFIC (e.g., the RFIC 352 of FIG. 3) or an antenna (e.g., the antenna 248 of FIG. 2 or the antenna array 330 of FIG. 3). The RFIC 352 and the antenna array 330 may be mounted on opposite surfaces of the third antenna module 246. For example, the antenna array 330 may be mounted on the front surface of the third antenna module 246, and the RFIC 352 may be mounted on the rear surface of the third antenna module 246. The antenna array 330 may include a plurality of antenna arrays (e.g., dipole antenna arrays and/or patch antenna arrays) of the same or different shapes or kinds.

Figure 8A:
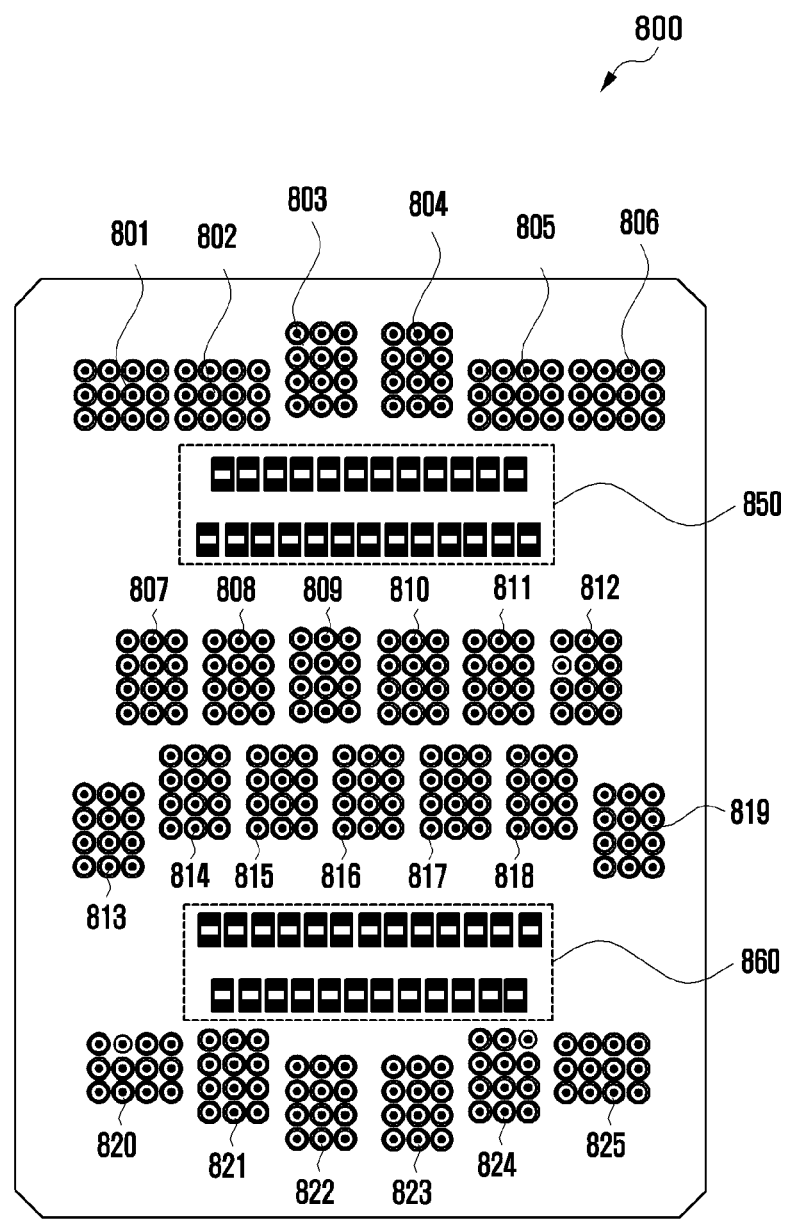
FIG. 8A is a view illustrating a PCB embedded filter having via group patterns used for a shield box according to various embodiments.

FIG. 8A is a view illustrating a PCB embedded filter having via group patterns used for a shield box according to various embodiments.

Referring to FIG. 8A, the shield box is an inspection device that inspects the performance of an electronic device (e.g., the electronic device 101 of FIG. 1), and an existing filter may not filter out a millimeter wave frequency operated in the electronic device 101. To achieve this, a PCB embedded filter 800 having via group patterns may be mounted at a location at which a connector (e.g., a D-sub connector) that connects the interior and the exterior of the shield box is disposed.

The PCB embedded filter 800 may be similar to the band stop filter 430 of FIG. 4. The PCB embedded filter 800 can prevent a signal in the interior of the shield box from being radiated (or output), and can prevent a signal outside the shield box from being input to the interior of the shield box. The PCB embedded filter 800 may include via group patterns connected to the signal lines of the input terminal (e.g., 850) and the output terminal (e.g., 860) of the connector that connects the interior and the exterior of the shield box. For example, when twenty five signal lines are provided in the connector, the PCB embedded filter may include twenty five via group patterns (e.g., 801, 802, 803, 804, 805, 806, 807, 808, 809, 811, 812, 813, 814, 815, 816, 817, 818, 819, 820, 821, 822, 823, 823, 824, and 825). When six signal lines are provided in the connector, the PCB embedded filter may include six via group patterns.

One via group pattern may mean not that a plurality of vias (or via holes) are dispersed (or distributed) but that a plurality of vias are collected in groups. One via included in the PCB embedded filter 800 may be operated as one LC filter. Because one LC filter cannot stop a millimeter wave frequency, one or more LC filters may be necessary. To achieve this, one via group pattern may include one or more vias. The frequency bands that are stopped may become different according to at least the lengths of vias, the diameters of signal lines in the vias, or gaps in the vias. Accordingly, at least the number of vias, the lengths of the vias, the diameters of signal lines in the vias, or gaps in the vias may be determined in consideration of an inductance and a capacitance that are necessary for the PCB embedded filter 800 to be operated as an LC filter. For example, when the printed circuit board used in the PCB embedded filter 800 includes six layers, the number of vias included in one via group pattern may be twelve or less.

According to various embodiments, when the PCB embedded filter 800 is mounted on a shield box, the connector may be vertically mounted on the PCB embedded filter 800. When the connector is horizontally connected to the PCB embedded filter 800, a signal may be radiated to the outside through a connector at a millimeter wave frequency band. Accordingly, the connector is vertically mounted on the PCB embedded filter 800 whereby an input signal is delivered to an inner layer of the PCB embedded filter 800 without being leaked and a signal to the interior or the exterior of the shield box can be prevented from being radiated.

According to various embodiments, the via group patterns disposed in the PCB embedded filter 800 may be realized not in the inner forms but in the form of through vias. To prevent a signal from being additionally radiated from a surface of the PCB embedded filter 800, spaces adjacent to the upper and lower ends of the vias may be secured and the remaining surface areas of the PCB embedded filter 800 may be interrupted. A surface of the PCB embedded filter 800 except for the vias can be prevented from being coupled to adjacent parts through air even when being connected to the shield box by GND processing the surface of the PCB embedded filter 800.

Figure 8B:
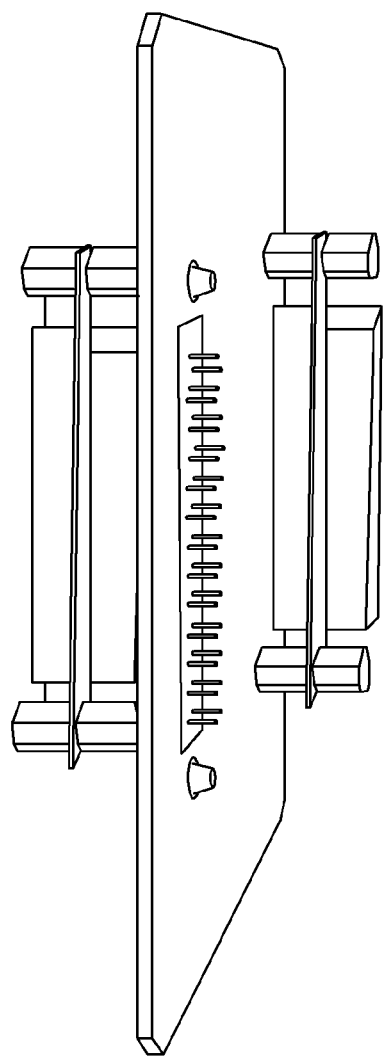
FIG. 8B is a cross-sectional view of a PCB embedded filter having via group patterns used for a shield box according to various embodiments.

FIG. 8B is a cross-sectional view of a PCB embedded filter having via group patterns used for a shield box according to various embodiments.

Referring to FIG. 8B, a view viewed from a side when the PCB embedded filter 800 is connected to a connector (e.g., a D-sub connector) is illustrated.

Figure 9:
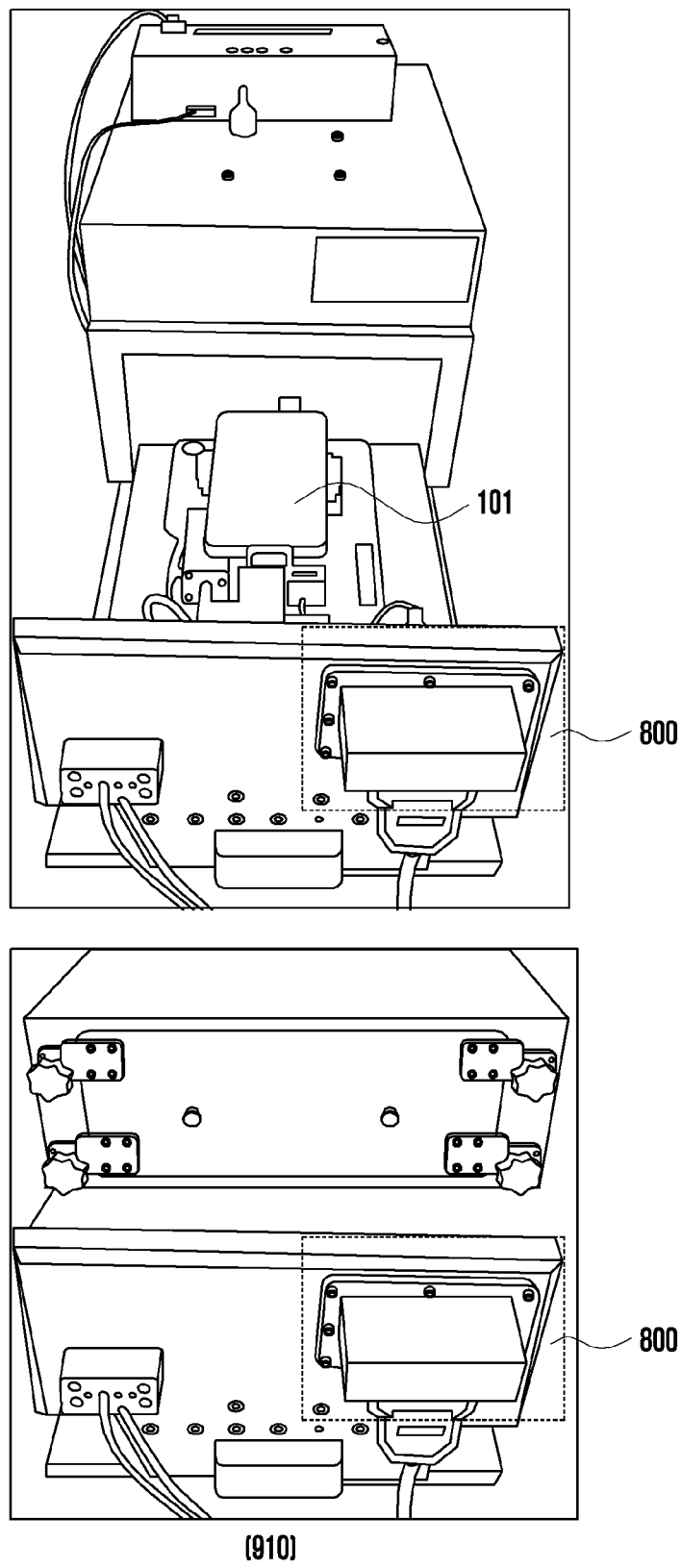
FIG. 9 is a view illustrating a shield box according to various embodiments.

FIG. 9 is a view illustrating a shield box according to various embodiments.

Referring to FIG. 9, a shield box 910 may be an inspection device that inspects the performance of an electronic device (e.g., the electronic device 101 of FIG. 1). Because the electronic device 101 uses a millimeter wave frequency when a signal is transmitted or received, the shield box 910 may use a millimeter wave frequency when the performance of the signal is inspected. The electronic device 101 may be located on a device holder in the interior of t h shield box 910, and may be completely interrupted from the outside by closing the shield box 910. The shield box 910 can inspect the performance of a signal of the electronic device 101 by preventing a signal in the interior of the shield box 910 from being radiated (or output) or preventing a signal outside the shield box 910 from being input to the interior of the shield box 910. A signal in the interior of the shield box 910 can be prevented from being radiated (or output) or a signal outside the shield box 910 can be prevented from being input to the interior of the shield box by mounting the PCB embedded filter 800 at a location at which a connector that connects the interior and the exterior of the shield box 910 is disposed.

Figure 10:
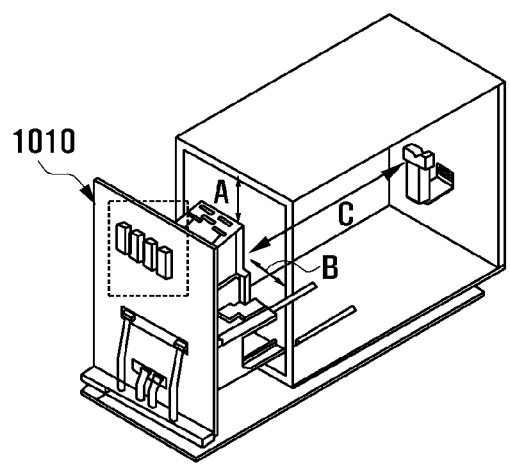
FIG. 10 is a view illustrating an example of applying a PCB embedded filter based on various connectors according to various embodiments.
Figure 10:
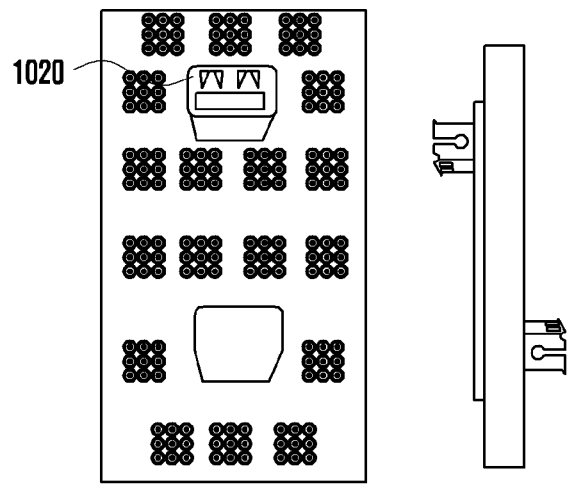
Figure 10:
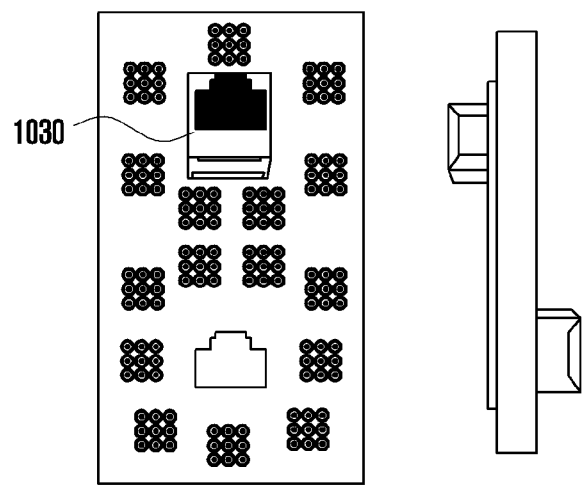

FIG. 10 is a view illustrating an example of applying a PCB embedded filter based on various connectors according to various embodiments.

Referring to FIG. 10, a power over Ethernet (POW) terminal as an outdoor product may be attached to customer premise equipment (CPE) that verifies a 5G communication system. The CPE may perform a performance inspection for radiation of signals by mounted the PCB embedded filter 800 at a location at which the POW terminal 1010 is attached. According to various embodiments, the connector connected to the shield box may be a universal serial bus (USB) or an Ethernet connector. When the shield box is connected to the outside by a USB (e.g., USB 2.0 or USB 3.0) connector 1020, the number of the via group patterns of the PCB embedded filter 800 may be determined based on the number (e.g., 5 pins or 9 pins) of the pins of the USB connector. When nine signal lines are provided in the USB connector, the PCB embedded filter may include nine via group patterns. Because the PCB embedded filter, as in FIG. 8, is connected to both the input terminal and the output terminal of the connector, a total of eighteen via group patterns may be included.

When the shield box is connected to the outside by an Ethernet connector, the number of the via group patterns of the PCB embedded filter may be determined based on the pin number (e.g., 8 pins) of the Ethernet connector 1030. When eight signal lines are provided in the Ethernet connector, the PCB embedded filter may include eight via group patterns. Because the PCB embedded filter, as in FIG. 8, is connected to both the input terminal and the output terminal of the connector, a total of sixteen via group patterns may be included.

According to various embodiments, in the PCB embedded filter connected to the USB connector 1020, the PCB embedded filter connected to the Ethernet connector 1030, or the PCB embedded filter 800 connected to the D-sub connector, the number of vias included in one via group pattern, the lengths of the vias, the diameters of the signal lines in the vias, or the gaps in the vias may be the same or different.

Figure 11:
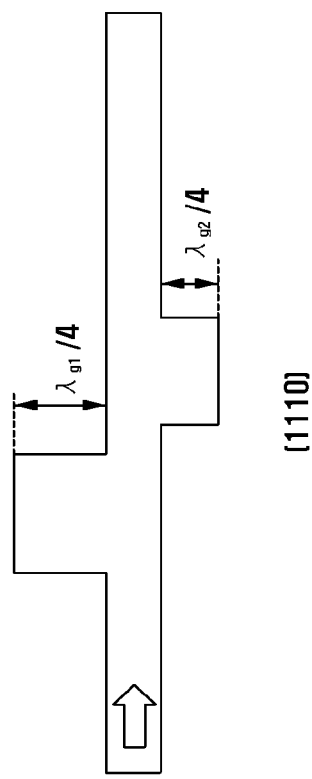
FIG. 11 is a view illustrating an example of a PCB embedded filter used for a shield box according to various embodiments.

FIG. 11 is a view illustrating an example of a PCB embedded filter used for a shield box according to various embodiments.

Referring to FIG. 11, resonance characteristics can be reinforced by generating a double-pole by using two open stubs 1110 in a feed line of an PCB embedded filter. For the open stubs 1110, if a λg/4 stop is designed according to a millimeter wave frequency (e.g., 28 GHz or 39 GHz) band, a millimeter wave frequency signal does not pass and is introduced to the ground GND to be interrupted. In order to adjust signal characteristics more precisely, a stub of a millimeter wave frequency band may be used for the open stubs 1110 repeatedly, and may be designed in multiple stages by utilizing a multi-resonance frequency (28/32/35/39 GHz) to improve the overall frequency band characteristics.

According to various embodiments, because via group patterns are disposed in a main printed circuit board of an electronic device, they can be utilized as interruption filters that prevent a received or transmitted millimeter wave frequency signal from being coupled to an adjacent line to lower performance.

According to various embodiments, because via group patterns are directly disposed in a printed circuit board, a band stop filter of a small size can be manufactured, and filter machining (or mounting) costs can be reduced.

According to various embodiments, deterioration of the RF performance of a millimeter wave frequency band can be prevented, and various circuit or structure designs can be allowed.

According to various embodiments, because a printed circuit board having via group patterns is attached to the outside of a shield box, a signal outside of the shield box can be interrupted when the beam forming radiation performance of an electronic device that uses a millimeter wave frequency is verified, and an internal signal in the interior of a shield box can be prevented from flowing to the outside and thus a defective inspection can be prevented.

The embodiments of the disclosure, which are described and illustrated in the specification and the drawings, are merely specific examples for understanding of the technical contents of the disclosure, and are not intended to limit the scope of the disclosure. Therefore, it should be construed that all changes or modifications deduced based on the technical spirit of the disclosure, in addition to the embodiments disclosed herein, fall within the scope of the disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a main printed circuit board in which a band stop filter that interrupts at least some signals corresponding to a signal received from or transmitted to an antenna module is formed in via group patterns; and
   the antenna module connected to the main printed circuit board,
   wherein the band stop filter is disposed between an intermediate frequency integrated circuit (IFIC) and a radio frequency integrated circuit (RFIC) and prevent the signal from being induced in an adjacent signal line of the IFIC or the RFIC, and
   wherein the via group patterns comprise a plurality of vias are collected in groups and one via included in the via group patterns is operated as one LC filter.

2. The electronic device of claim 1, wherein the band stop filter is configured such that the antenna module is disposed close to a location connected to the main printed circuit board.

3. The electronic device of claim 1, wherein the main printed circuit board further comprises a communication processor or an intermediate frequency integrated circuit (IFIC),
   wherein the antenna module comprises a radio frequency integrated circuit (RFIC) or an antenna array.

4. The electronic device of claim 3, wherein when the electronic device transmits a signal outside, an input terminal of the band stop filter is the IFIC and an output terminal of the band stop filter is the RFIC, and
   wherein when the electronic device receives a signal from the outside, the input terminal of the band stop filter is the RFIC and the output terminal of the band stop filter is the IFIC.

5. The electronic device of claim 1, wherein the band stop filter determines a number of the via group patterns based on a connector connected to the antenna module.

6. The electronic device of claim 1, wherein the band stop filter is configured such that a number of the via group patterns is determined to correspond to a number of pins of a connector connected to the antenna module.

7. The electronic device of claim 1, wherein when the via group patterns comprise a plurality of vias, at least lengths of the vias, diameters of signal lines in the vias or gaps in the vias are set to the same or similar.

8. The electronic device of claim 1,
   wherein frequency bands that are stopped are set to be different according to at least lengths of vias, diameters of signal lines in the vias, or gaps in the vias.

9. The electronic device of claim 1, wherein at least a number of vias, lengths of the vias, diameters of signal lines in the vias, or gaps in the vias are determined in consideration of an inductance and a capacitance that are necessary for the band stop filter to be operated as an LC filter.

10. The electronic device of claim 9, wherein the main printed circuit board has multiple layers, and
    the lengths of the vias are set to vary based on a number of the layers laminated on the main printed circuit board.

11. The electronic device of claim 1, wherein the band stop filter determines diameters of signal lines in vias included in the via group patterns, and
    wherein a length of the vias or gaps in the vias are determined based on the determined diameters of signal lines in the vias.

12. The electronic device of claim 1, wherein when the band stop filter is connected to the antenna module through a serial peripheral interface (SPI) connector, a plurality of the via group patterns are disposed to correspond to signal lines of the SPI connector.

13. The electronic device of claim 12, wherein when the via group patterns are configured such that at least a number of vias, via forming patterns, a length of the vias, diameters of signal lines in the vias or gaps in the vias are set to the same or similar.

14. The electronic device of claim 13, wherein a plurality of the via group patterns are configured such that at least a number of vias, via forming patterns, the length of the vias, the diameters of signal lines in the vias or gaps in the vias are set to the same or similar, based on a kind of signal lines connected to the via group patterns.

15. The electronic device of claim 1, wherein when the band stop filter is connected to the antenna module through a coaxial cable connector, one via group pattern is formed.

16. A printed circuit board wherein a band stop filter that interrupts at least some signals received from or transmitted outside is formed in via group patterns on the printed circuit board,
    wherein the band stop filter is disposed between an intermediate frequency integrated circuit (IFIC) and a radio frequency integrated circuit (RFIC) and prevent the signal from being induced in an adjacent signal line of the IFIC or the RFIC, and
    wherein the via group patterns comprise a plurality of vias are collected in groups and one via included in the via group patterns is operated as one LC filter.

17. The printed circuit board of claim 16, wherein at least a number of vias included in the via group patterns, a lengths of the vias, diameters of signal lines in the vias, or gaps in the vias are determined in consideration of an inductance and a capacitance that are necessary for the band stop filter to be operated as the LC filter.

18. The printed circuit board of claim 16, wherein at least lengths of vias, via forming patterns, diameters of signal lines in the vias or gaps in the vias are set to the same or similar.

19. The printed circuit board of claim 16, wherein the printed circuit board is configured to be used as a main printed circuit board of an electronic device.

20. The printed circuit board of claim 16, wherein the printed circuit board is configured to be used as an interruption filter for a shield box that inspects an electronic device.

* * * * *